(12) United States Patent
Mankos et al.

(10) Patent No.: US 7,205,542 B1
(45) Date of Patent: Apr. 17, 2007

(54) SCANNING ELECTRON MICROSCOPE WITH CURVED AXES

(75) Inventors: Marian Mankos, Palo Alto, CA (US);
Kurt Weiner, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/343,418

(22) Filed: Jan. 31, 2006

Related U.S. Application Data

(60) Provisional application No. 60/736,439, filed on Nov. 14, 2005.

(51) Int. Cl.
*H01J 37/304* (2006.01)

(52) U.S. Cl. .............. 250/310; 250/311; 250/396 R; 250/396 ML; 250/306; 250/307; 250/492.2

(58) Field of Classification Search .............. None
See application file for complete search history.

(56) References Cited

U.S. PATENT DOCUMENTS

| | | | |
|---|---|---|---|
| 5,003,172 A | 3/1991 | Kruit et al. | |
| 5,336,885 A | 8/1994 | Rose et al. | |
| 5,973,323 A | 10/1999 | Adler et al. | |
| 6,087,659 A | 7/2000 | Adler et al. | |
| 6,265,719 B1 | 7/2001 | Yamazaki et al. | |
| 6,310,341 B1 | 10/2001 | Todokoro et al. | |
| 6,407,384 B1 | 6/2002 | Tanaka et al. | |
| 6,586,733 B1 | 7/2003 | Veneklasen et al. | |
| 6,610,980 B2 | 8/2003 | Veneklasen et al. | |
| 6,624,412 B2 | 9/2003 | Tanaka et al. | |
| 6,759,654 B1 | 7/2004 | Mankos et al. | |
| 6,797,954 B2 | 9/2004 | Shinada et al. | |
| 6,803,571 B1 | 10/2004 | Mankos et al. | |
| 6,803,572 B2 | 10/2004 | Veneklasen et al. | |
| 6,812,461 B1 | 11/2004 | Adler et al. | |
| 6,858,843 B1 | 2/2005 | Mankos et al. | |
| 6,903,337 B2 | 6/2005 | Kienzle et al. | |
| 6,946,657 B2 | 9/2005 | Kienzle et al. | |
| 2004/0065827 A1 | 4/2004 | Kienzle et al. | |
| 2004/0108457 A1 | 6/2004 | Kienzle et al. | |
| 2004/0188608 A1 | 9/2004 | Kaneyama | |
| 2004/0188613 A1 | 9/2004 | Kaji et al. | |
| 2004/0222377 A1 | 11/2004 | Shineda et al. | |
| 2005/0067564 A1* | 3/2005 | Douglas et al. ............. 250/290 |

\* cited by examiner

*Primary Examiner*—Nikita Wells
*Assistant Examiner*—Zia R. Hashmi
(74) *Attorney, Agent, or Firm*—Okamoto & Benedicto LLP

(57) ABSTRACT

One embodiment relates to a scanning electron beam apparatus having curved electron-optical axes. An electron gun and illumination electron optics are configured to generate a primary electron beam along a first axis. Objective electron optics is configured about a second axis to receive the primary electron beam, to focus the incident electron beam onto the substrate, and to retrieve an emitted beam of scattered electrons from the substrate. Detection electron optics is configured about a third axis to receive the emitted beam and to focus the emitted beam onto a detector. A beam separator is coupled to and interconnecting the illumination electron optics, the objective electron optics, and the detection electron optics in such a way that there is a same angle between the first and second axes as between the second and third axes. A beam deflector is configured to controllably scan the primary electron beam across the substrate and to de-scan the emitted electron beam. Other embodiments are also disclosed.

29 Claims, 8 Drawing Sheets

SCANNING ELECTRON MICROSCOPE WITH CURVED AXES

CROSS-REFERENCE TO RELATED APPLICATION(S)

The present application claims the benefit of U.S. Provisional Patent Application No. 60/736,439, entitled "Scanning Electron Microscope with Curved Axes," filed by Marian Mankos and Kurt Weiner on Nov. 14, 2005.

GOVERNMENT LICENSE RIGHTS

The U.S. Government has a paid-up license in this invention and the right in limited circumstances to require the patent owner to license others on reasonable terms as provided for by the terms of Contract No. DAAD19-00-3-1001 awarded by the Defense Advanced Research Projects Agency.

BACKGROUND OF THE INVENTION

1. Field of the Invention

The present invention relates to scanning electron beam apparatus and methods for inspection or defect review of substrates, such as semiconductor wafers and masks.

2. Description of the Background Art

Scanning electron beam systems are utilized for the inspection and defect review of semiconductor substrates and for other purposes. A conventional scanning electron beam system utilizes a straight optical axis down an electron-optical column. The signal electrons are generally detected with either an annular detector, a combination of a Wien filter and an off-axis detector, or an Everhart-Thornley detector (secondary electrons and no extraction field only).

With a straight optical axis, the detection electron-optics overlaps with the illumination electron-optics. This overlap often disadvantageously limits the detection functionality, efficiency and flexibility.

For example, with an annular detector, it is difficult to detect all the signal electrons under all imaging conditions, where the imaging conditions may include various landing energies, extraction field strengths, and Wehnelt electrode biases. This difficulty reduces the detection efficiency and limits throughput of an inspection system.

As another example, a Wien filter used to deflect the secondary electrons may induce aberrations of the primary beam. Such aberrations reduce the system resolution. In addition, the beam deflection tends to increase the region across which the signal electron move in the detector plane. This larger region in the detector plane results in a need for a larger area detector which limits the detection speed.

In addition, with a straight optical axis, it is often difficult to discriminate the signal electrons based on their energy. In other words, it is often difficult to implement an energy filter with the conventional geometry.

SUMMARY

One embodiment relates to a scanning electron beam apparatus having curved electron-optical axes. An electron gun and illumination electron optics are configured to generate a primary electron beam along a first axis. Objective electron optics is configured about a second axis to receive the primary electron beam, to focus the incident electron beam onto the substrate, and to retrieve an emitted beam of scattered electrons from the substrate. Detection electron optics is configured about a third axis to receive the emitted beam and to focus the emitted beam onto a detector. A beam separator is coupled to and interconnecting the illumination electron optics, the objective electron optics, and the detection electron optics in such a way that there is a same angle between the first and second axes as between the second and third axes. A beam deflector is configured to controllably scan the primary electron beam across the substrate and to de-scan the emitted electron beam.

Other embodiments are also disclosed.

DETAILED DESCRIPTION

Scanning Electron Beam Apparatus with Curved Optical Axes

Figure 1:
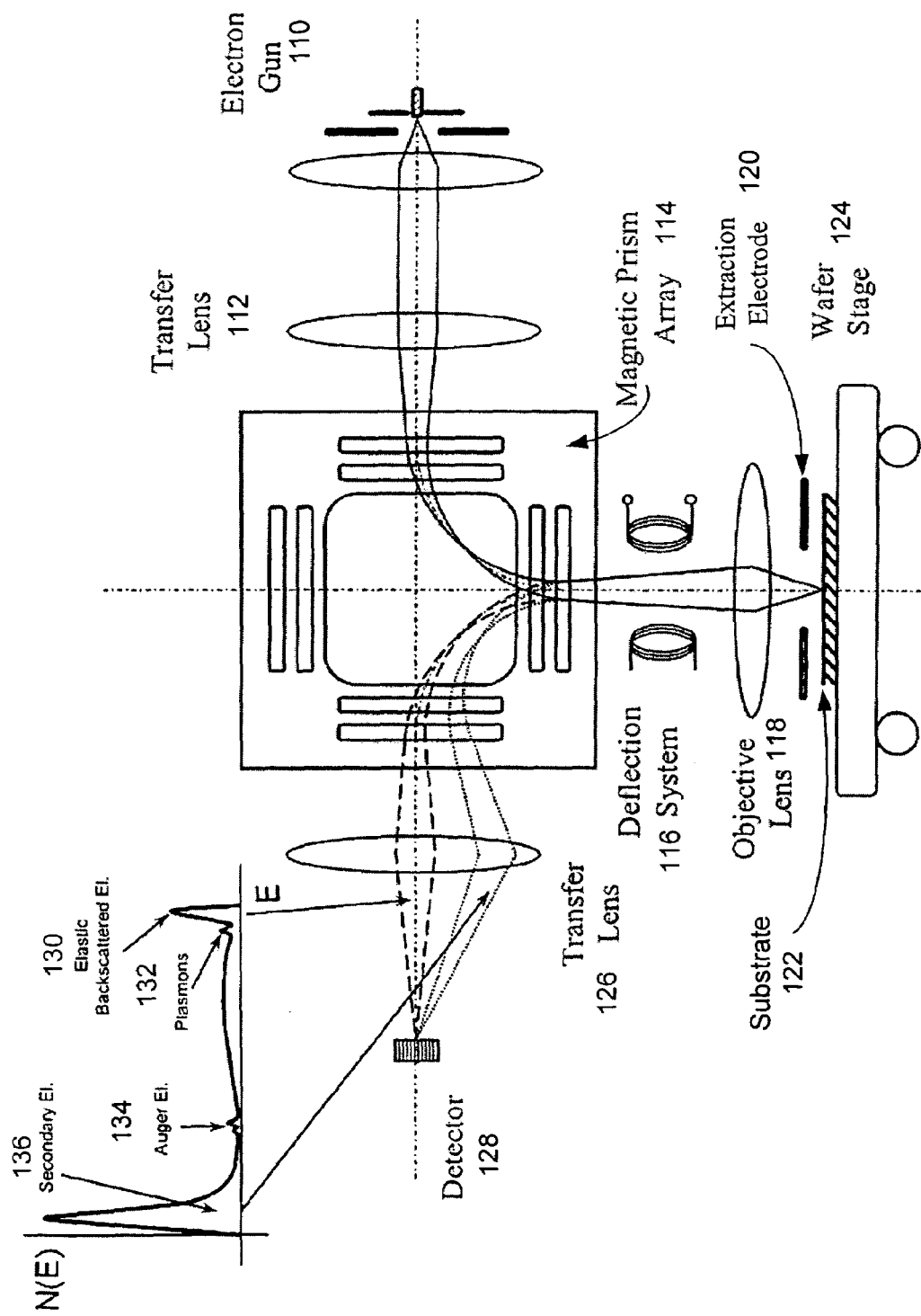
FIG. 1 is a schematic diagram depicting a scanning electron beam apparatus having a curved optical axis for incident and scattered electron beams in accordance with an embodiment of the invention.

FIG. 1 is a schematic diagram depicting a scanning electron beam apparatus 100 having curved optical axes for primary and scattered electron beams in accordance with an embodiment of the invention. The apparatus may be utilized, for example, to inspect a substrate or for defect review. The apparatus 100 is configured so as to have curved, not straight, optical axes for the primary and scattered electron beams. This is achieved by use of a magnetic prism array 114 or similar beam separator device.

As seen in FIG. 1, the electron-optical system is composed of four subsystems: the illumination optics (including the lens of the electron gun 110 and first transfer lens 112), the objective optics (including the objective lens 118), the detection optics (including the second transfer lens 126), and the beam separator or beam splitter (comprising, for example, the magnetic prism array 114). In FIG. 1, the illumination and detection optics are oriented along a horizontal optical axis, while the objective optics is oriented along a vertical optical axis.

The optical axis for the primary electron beam begins at the electron gun 110 and extends in a line through the illumination optics until reaching the magnetic prism array 114. Within the magnetic prism array 114, the optical axis for the primary electron beam bends by ninety degrees or thereabout so as to be oriented towards the objective optics. Upon exit of the magnetic prism array 114, the optical axis for the primary electron beam extends in a line through the objective optics until reaching the substrate 122.

The optical axis for the scattered electron beam begins at the substrate 122 and extends in a line through the objective optics until reaching the magnetic prism array 114. Within the magnetic prism array 114, the optical axis for the scattered electron beam bends so as to be oriented towards the detection optics. Upon exit from the magnetic prism array 114, the optical axis for the scattered electron beam extends in a line through the detection optics until reaching the detector 128.

One specific embodiment of the beam separator comprises a magnetic prism array 114, for example, such as the one disclosed in U.S. Pat. No. 6,878,937, which is entitled "Prism array for electron beam inspection and defect review" and which issued Apr. 12, 2005 to inventor Marian Mankos. The disclosure of the aforementioned patent is hereby incorporated by reference. Per that disclosure, the magnetic prism array 114 may comprise a compact, double focusing magnetic prism array. The prism array 114 may be configured to include a central magnetic section, an inner magnetic section outside the central section, and an outer magnetic section outside the inner section. Each magnetic section may be configured so as to provide a uniform magnetic field of different strength and/or length. This allows obtaining stigmatic focusing and makes the prism array 114 behave as a round lens, which simplifies set-up, alignment and operation of the apparatus.

The electron gun 110 for generating the primary electron beam may comprise, for example, a thermionic field emission (Schottky) gun. The electron gun 110 may include a gun lens (shown in the figure). Electrons emitted from the gun 110 are collimated and are focused at an achromatic plane in the prism array 114. The magnetic prism array 114 deflects the trajectory of the primary electron beam by ninety degrees. The objective lens 118 is configured so as to decelerate and refocus the primary electron beam onto a spot on the surface of the substrate 122. The magnetic deflection system 116 is configured to scan the primary electron beam spot in a direction perpendicular to the movement of the wafer stage 204. An extraction electrode 120 may be configured to extract secondary electrons from the substrate surface.

The scattered electron beam includes electrons emitted over a range of solid angles with energies ranging from near zero (secondary electrons 136) to the landing energy (backscattered electrons 130). Electrons with intermediate energies include Auger electrons 134 and also electrons that suffered from plasmon losses 132.

The scattered electrons are accelerated and collimated by the objective lens 118, and de-scanned by the deflection system 116. The magnetic prism array 114 deflects the trajectory of the primary electron beam by approximately ninety degrees (for the elastically backscattered electrons 130) or more (for the lower energy electrons).

Per the example embodiment shown in FIG. 1, the transfer lens 126 in the detection optics may be configured such that the scattered electrons of various energies are focused to the detector 126. Data collection circuitry coupled to the detector 128 is configured in synchronization with the deflection system 116 so as to be able to form a two-dimensional image of the data collected from the scanned area.

Spectral Integration Imaging Mode

Figure 2:
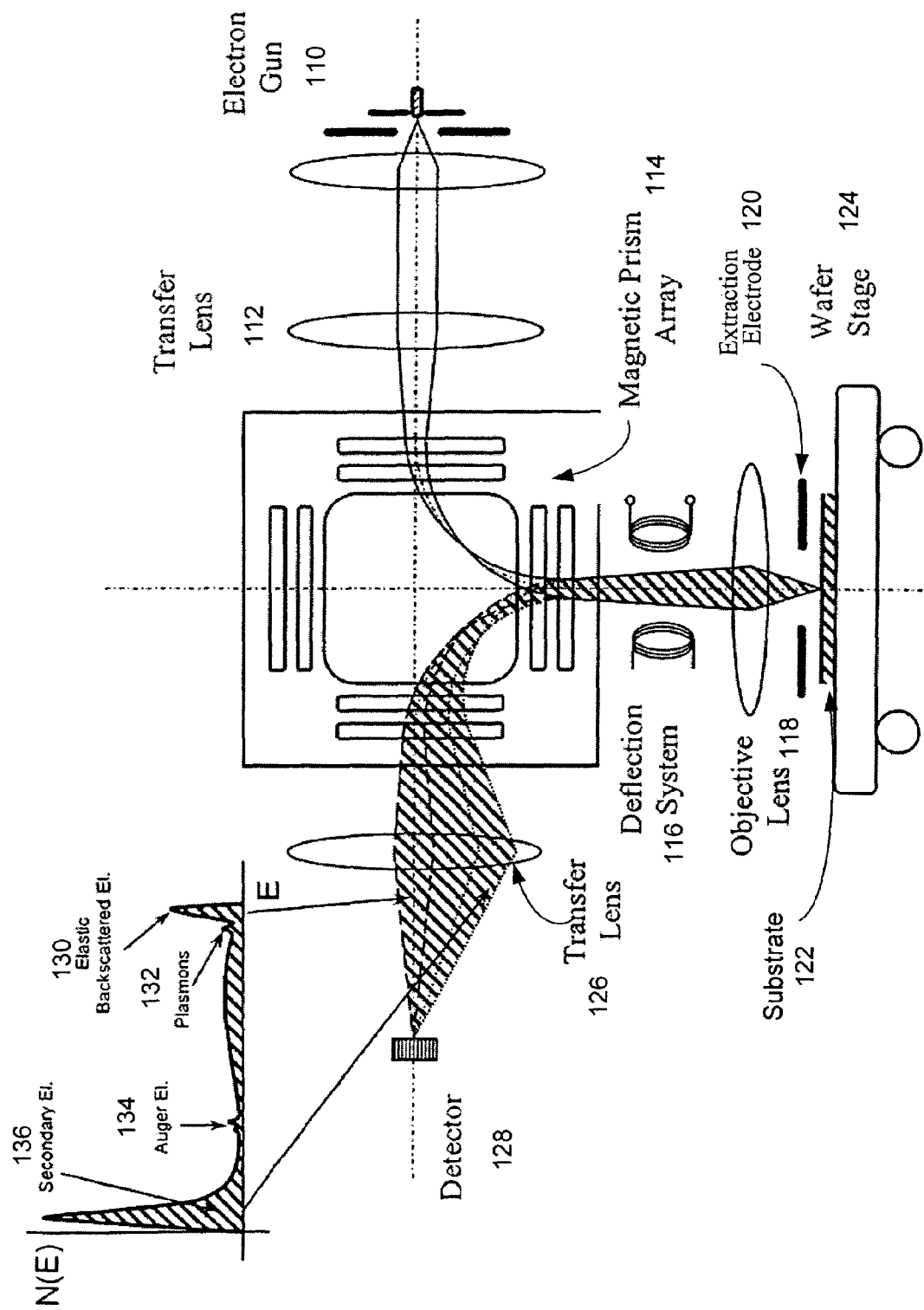
FIG. 2 depicts the scanning electron beam apparatus of FIG. 1, where the apparatus operates in a spectral integration mode in accordance with an embodiment of the invention.

FIG. 2 depicts the scanning electron beam apparatus of FIG. 1, where the apparatus operates in a spectral integration mode in accordance with an embodiment of the invention. As shown in FIGS. 1 and 2, the detector 128 may comprise a small area detector, and the detection optics may be configured such that all or practically all of the scattered electrons converge upon the small area detector. In other words, as indicated by the shading of the scattered electron beam in FIG. 2, the scattered electrons of various energies are focused by the second transfer lens 126 to the detector plane, and hence the integrated spectrum of the scattered electrons is detected.

Hence, in this spectral integration imaging mode, the detected signal includes the elastically backscattered electrons 130, the electrons that suffered plasmon losses 132, the Auger electrons 134, and the secondary electrons 136. Advantageously, this mode provides both high detection efficiency (due to the detection of all or mostly all of the signal electrons) and high detection speed (due to the smaller detector area).

Selected Energy (Energy Filtered) Imaging Mode

In accordance with other embodiments of the invention, the energy dispersion caused by the prism array 114 may be used to advantageously discriminate the scattered electrons based on their energy. In other words, the prism beam splitter 114 may be utilized to provide energy-filtering functionality. Embodiments using this energy-filtering functionality so as to selectively image backscattered or secondary electrons are now discussed in relation to FIGS. 3A and 3B.

Figure 3A:
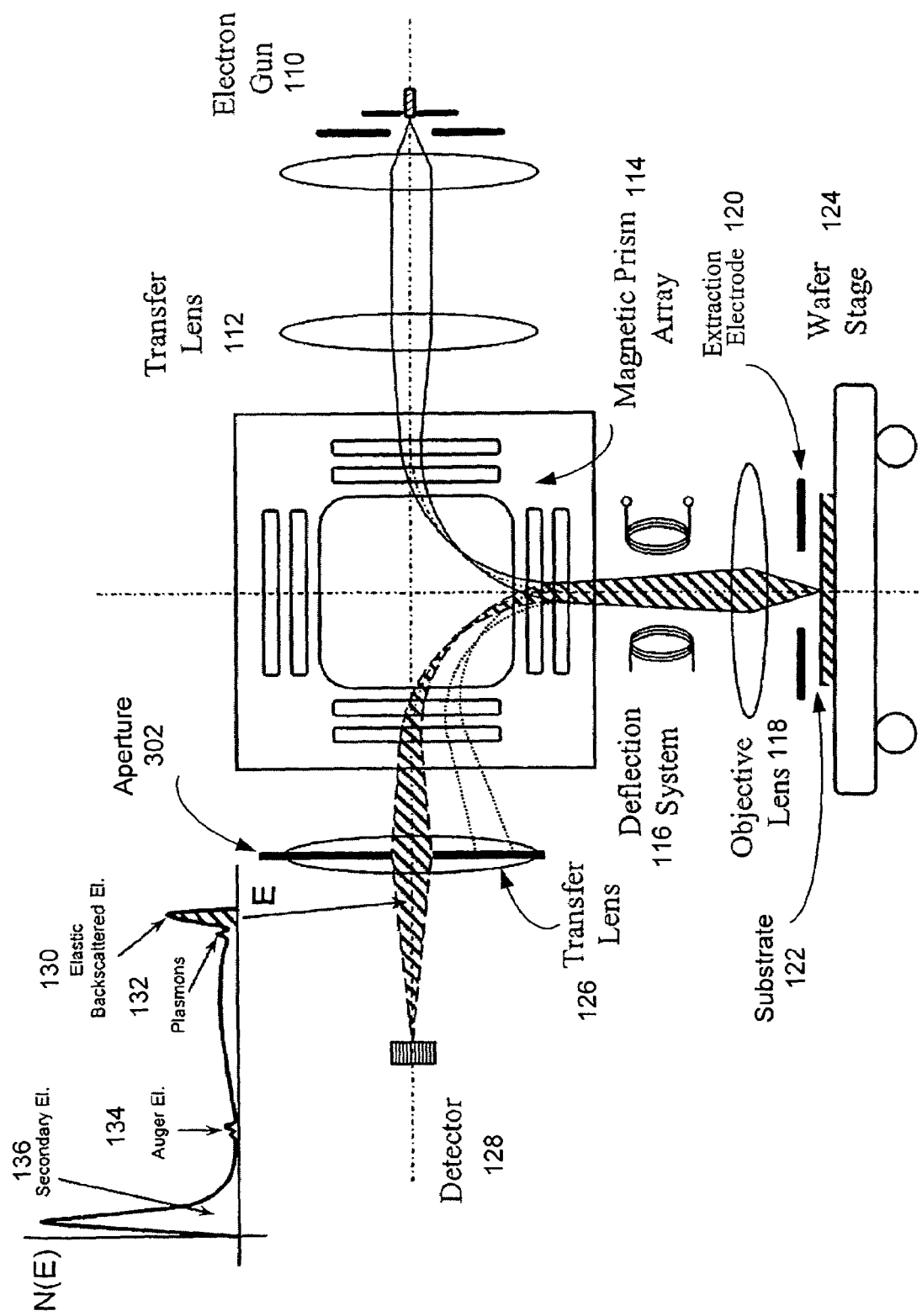
FIG. 3A is a schematic diagram depicting a scanning electron beam apparatus having a curved optical axis and an aperture positioned to selectively detect backscattered electrons in accordance with an embodiment of the invention.

FIG. 3A is a schematic diagram depicting a scanning electron beam apparatus 300 having a curved optical axis and an aperture 302 positioned to selectively detect backscattered electrons 130 in accordance with an embodiment of the invention. The aperture 302 may be positioned as shown in the energy-dispersive plane at the second transfer lens 126. The backscattered electrons 130 pass through the aperture 302 to the detector 128, while electrons with lower energies (for example, the electrons that suffered plasmon losses 132, the Auger electrons 134, and the secondary electrons 136) are blocked by the aperture 302 and so are not detected.

Figure 3B:
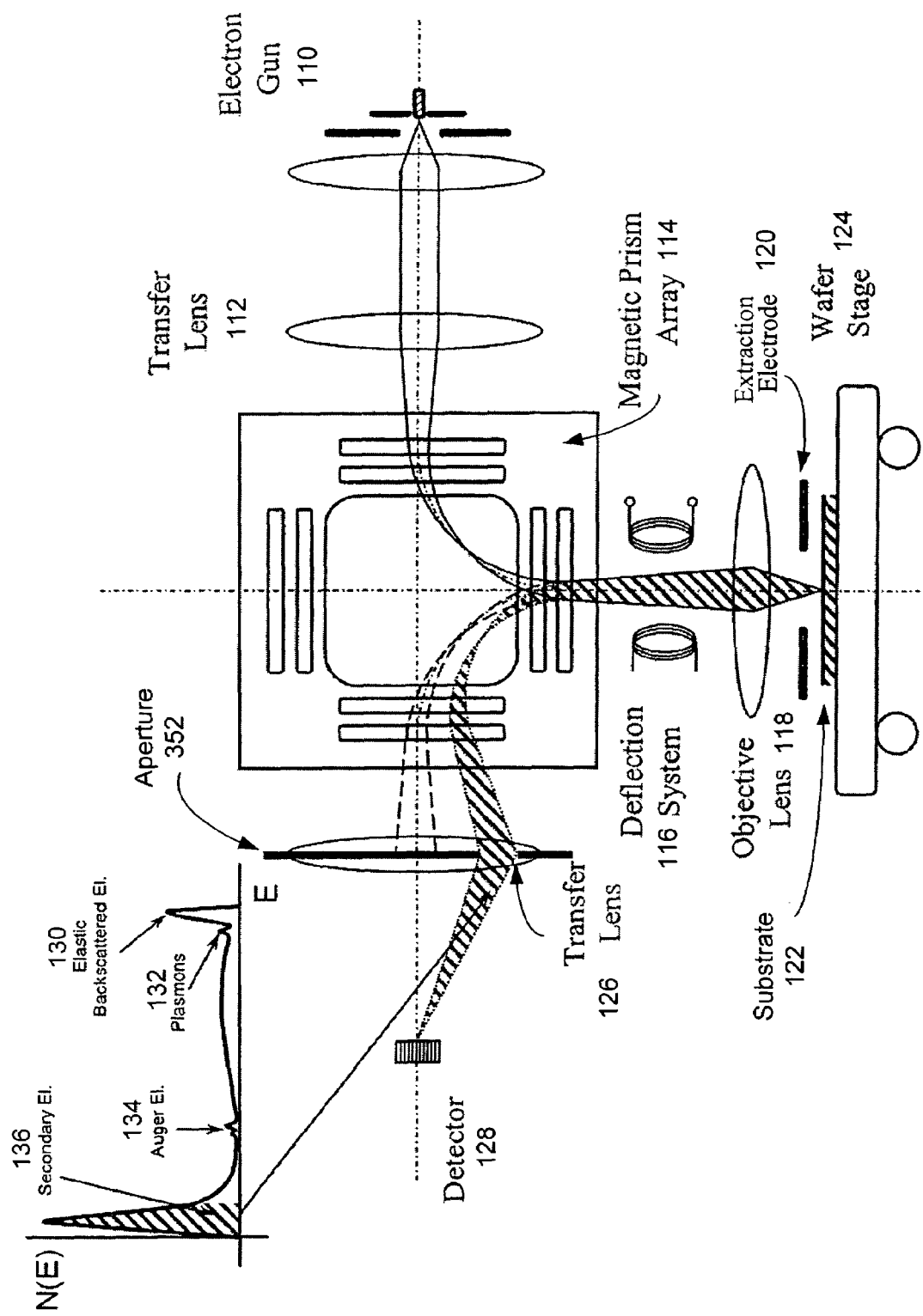
FIG. 3B is a schematic diagram depicting a scanning electron beam apparatus having a curved optical axis and an aperture positioned to selectively detect secondary electrons in accordance with an embodiment of the invention.

FIG. 3B is a schematic diagram depicting a scanning electron beam apparatus 350 having a curved optical axis and an aperture 352 positioned to selectively detect secondary electrons 136 in accordance with an embodiment of the invention. The aperture 352 may be positioned as shown in the energy-dispersive plane at the second transfer lens 126. The secondary electrons 136 pass through the aperture 352 to the detector 128, while electrons with other energies (for example, the Auger electrons 134, the electrons suffering plasmons losses 132, and the backscattered electrons 130) are blocked by the aperture 352 and so are not detected.

Energy Spectrum Imaging Mode

Figure 4:
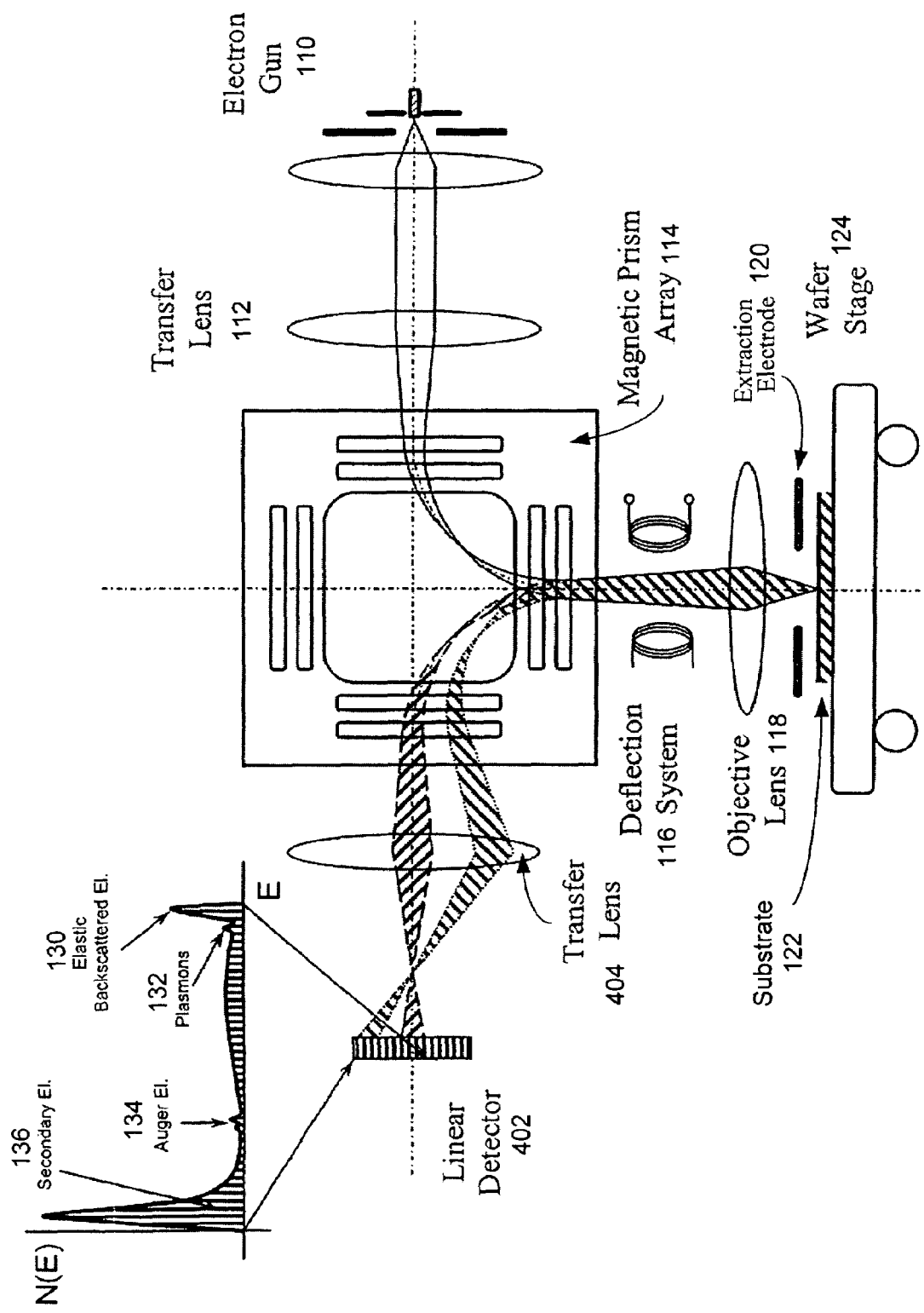
FIG. 4 is a schematic diagram depicting a scanning electron beam apparatus configured in an energy spectrum mode in accordance with an embodiment of the invention.

FIG. 4 is a schematic diagram depicting a scanning electron beam apparatus 400 configured in an energy spectrum mode in accordance with an embodiment of the invention. The apparatus 400 may be configured with a linear detector 402 which includes a linear array of detection elements. Alternatively, a detector with a two-dimensional array of detection elements may be used to similar effect. The array of detection elements may be utilized to provide the energy spectrum (i.e. N(E) in the upper left corner of the figure) of the scattered electrons. For example, as shown in FIG. 4, the backscattered electrons 130 impinge upon one section of the linear detector 402, while the secondary electrons 136 impinge upon a different section of the linear detector 402. The second transfer lens 404 may be configured so as to achieve such energy dispersion at the detector plane.

Dark Field Imaging Mode

Figure 5:
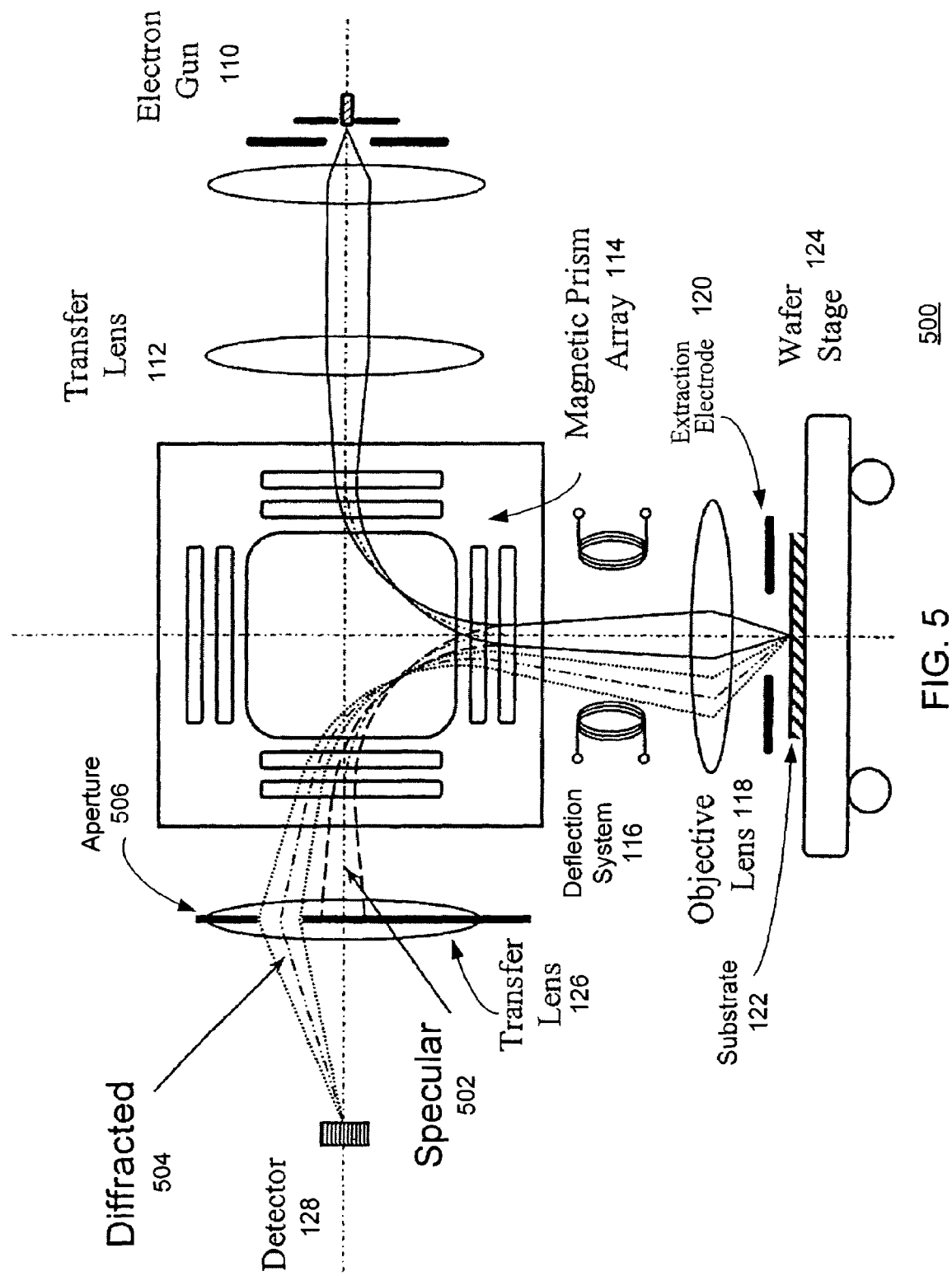
FIG. 5 is a schematic diagram depicting a scanning electron beam apparatus configured in a dark field imaging mode in accordance with an embodiment of the invention.

FIG. 5 is a schematic diagram depicting a scanning electron beam apparatus 500 configured in a dark field imaging mode in accordance with an embodiment of the invention. The apparatus 500 is configured to be able to generate an image based on selected diffracted electrons 504, rather than based on the specularly scattered electrons 502. For example, aperture 506 may be positioned as shown in the diffraction plane (same as energy-dispersive plane) at the second transfer lens 126. The diffracted electrons 504 selected by the aperture 506 pass through to the detector 128, while specularly scattered electrons 502 are blocked by the aperture 506 and so are not detected. The second transfer lens 126 focuses the selected electrons onto the detector 128 for dark field imaging.

Alternatively, the aperture 506 may be positioned so as to select the specular electrons 502 while blocking the diffracted electrons 504. This would provide a bright field imaging mode.

Diffraction Mode

Figure 6:
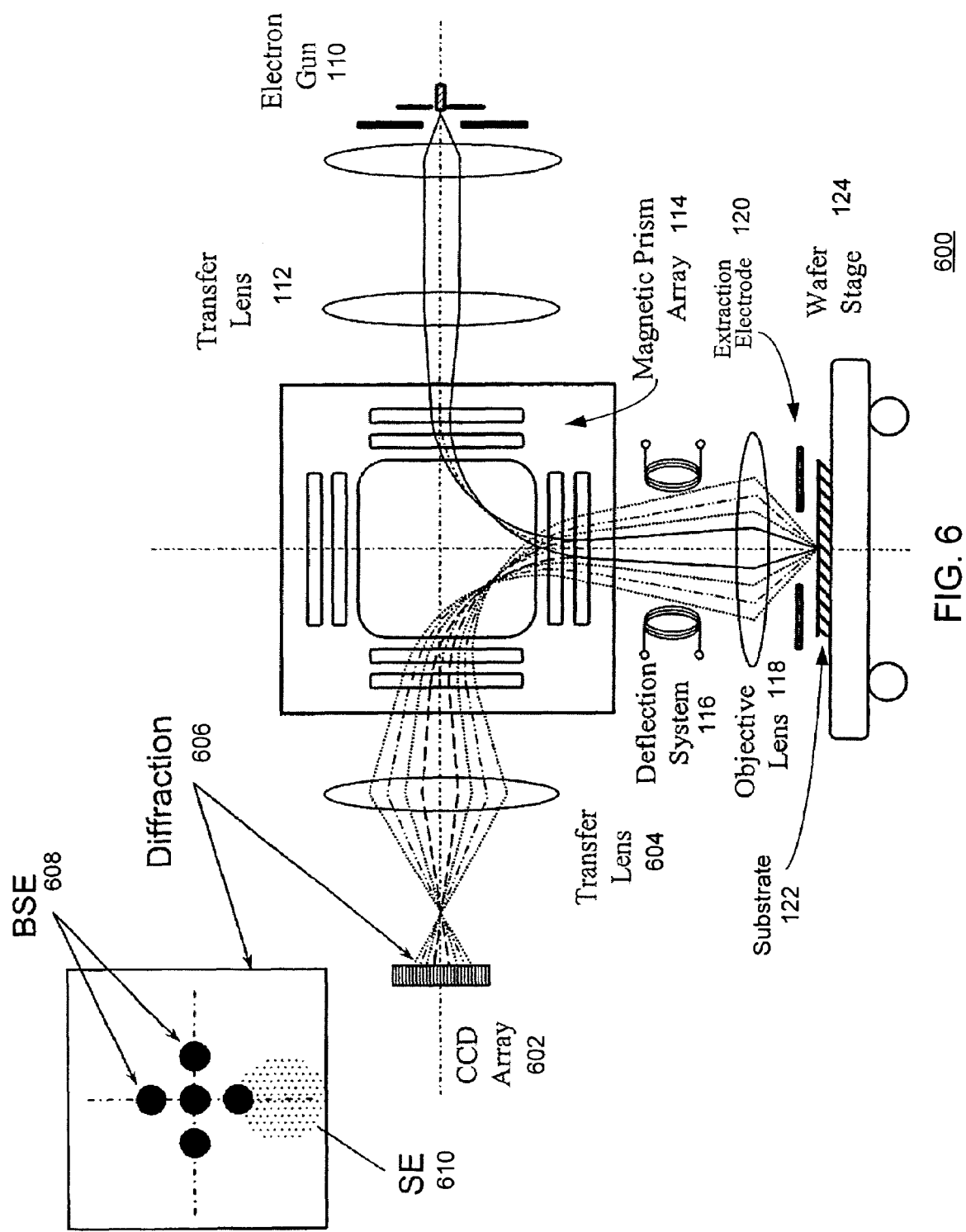
FIG. 6 is a schematic diagram depicting a scanning electron beam apparatus configured in a diffraction mode in accordance with an embodiment of the invention.

FIG. 6 is a schematic diagram depicting a scanning electron beam apparatus 600 configured in a diffraction mode in accordance with an embodiment of the invention. The second transfer lens 604 of the apparatus 600 is configured so as to generate a diffraction pattern 606 at the plane of the detector 602. The detector 602 may comprise a two-dimensional CCD (charge coupled device) array or other two-dimensional array. In this embodiment, the whole energy diffraction pattern 606 may be acquired at once for every position on the substrate 122, and the two-dimensional data may be processed using a computer.

The two-dimensional diffraction pattern 606 may include a superposition of a first diffraction pattern 608 from the backscattered electrons and a second pattern 610 from the secondary electrons. The second pattern 610 is shifted in position relative to the first diffraction pattern 608 due to the energy dispersion between the backscattered electrons 130 and the secondary electrons 136.

Direct Line of Sight

An additional aspect of the geometry discussed herein is that it allows a direct line of sight of the substrate 122. The direct line of sight is available from the side of the prism array 114 which is directly opposing the substrate 122.

Figure 7:
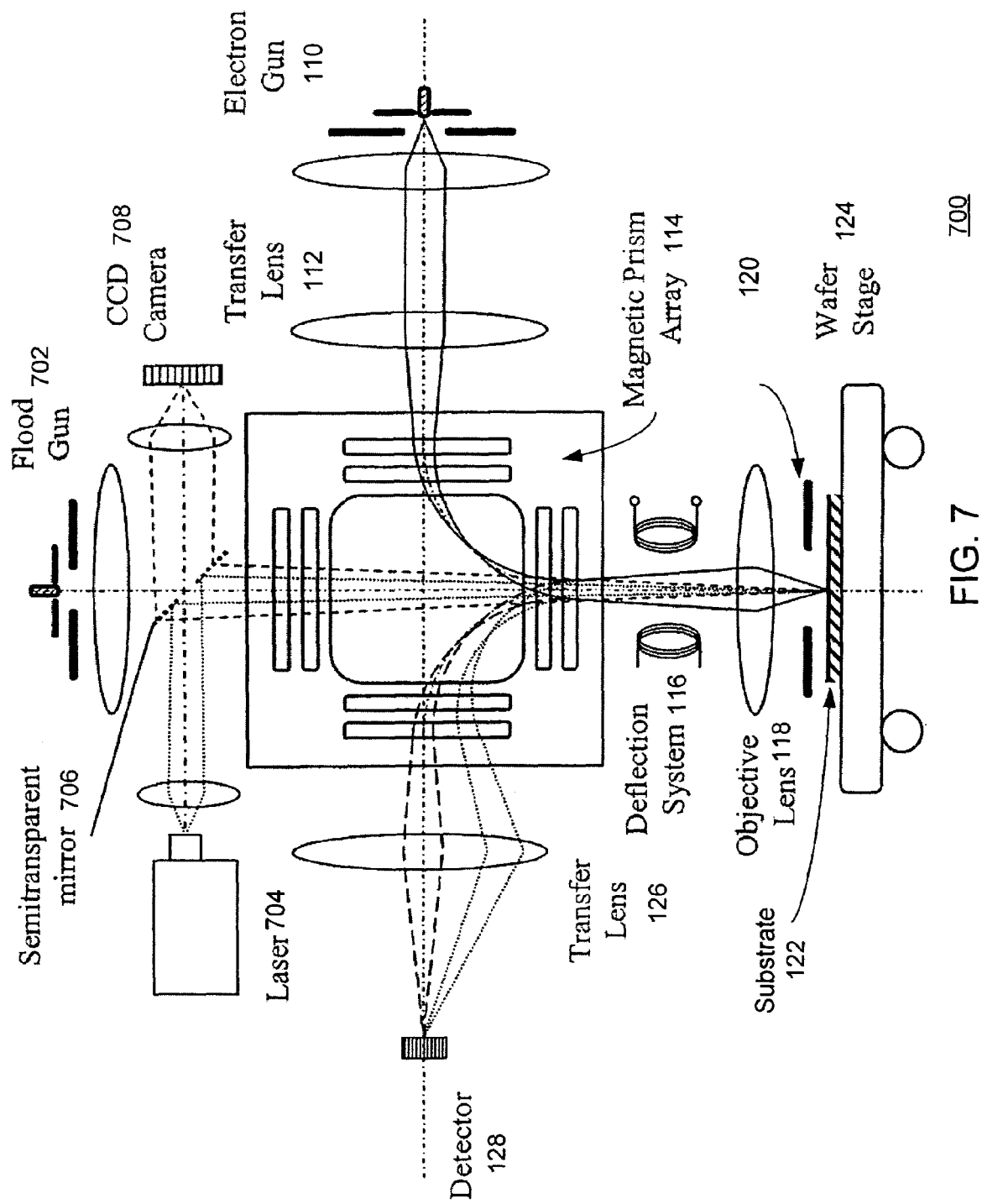
FIG. 7 is a schematic diagram depicting a scanning electron beam apparatus where advantage is taken of the direct line of sight to the substrate in accordance with an embodiment of the invention.

FIG. 7 is a schematic diagram depicting a scanning electron beam apparatus 700 wherein advantage is taken of the direct line of sight to the substrate 122 in accordance with an embodiment of the invention. As illustrated in FIG. 7, additional components may include, for example, a flood gun 702, a laser 704, a semitransparent mirror 706 and a CCD camera 708. The flood gun 702 may be configured to transmit a flood beam through the prism array 114 onto the surface of the substrate 122. Light from the laser 704 may be reflected by the semi-transparent mirror 706 onto the surface of the substrate 122. The laser light may also be transmitted through the semi-transparent mirror 706 to the CCD camera 708. Such additional components may be used for wafer height determinations and for other purposes.

CONCLUSION

A prism-based SEM (scanning electron microscope) with curved optical axes is disclosed herein. The detection optics is separated from the illumination optics. This improves the detection efficiency and flexibility and allows straightforward implementation of desirable imaging modes. Such imaging modes include energy filtering modes and dark field modes.

In accordance with certain embodiments of the invention, the area of the detector exposed by signal electrons may be advantageously reduced to less than one square millimeter. Hence, faster detectors with small detection areas may be employed.

In the selected energy imaging mode, a specific part of the energy spectrum (for example, secondary electrons, or backscattered electrons, or chemical-composition specific Auger electrons) may be included or excluded from the detected signal. Such an imaging mode may potentially increase contrast and thus improve defect detection sensitivity.

When the whole spectrum is acquired for each pixel in accordance with the energy spectrum imaging mode, a series of parallel images may be generated, each image with different energy characteristics. This opens up a new dimension for analyzing the data so as to increase defect detection sensitivity.

The dark field imaging and diffraction modes may be readily implemented so as to provide further information relating to a substrate being inspected or under defect review. In addition, due to the direct line of sight available in the disclosed geometry, coaxial light optics and a flood gun may be readily included.

The above-described diagrams are not necessarily to scale and are intended be illustrative and not limiting to a particular implementation. The above-described invention may be used in an automatic inspection or review system and applied to the inspection or review of optical or X-ray masks and similar substrates in a production environment.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A scanning electron beam apparatus having curved electron-optical axes, the apparatus comprising:

an electron gun and illumination electron optics configured to generate a primary electron beam along a first axis;

objective electron optics configured about a second axis to receive the primary electron beam, to focus the incident electron beam onto the substrate, and to retrieve an emitted beam of scattered electrons from the substrate;

detection electron optics configured about a third axis to receive the emitted beam and to focus the emitted beam onto a detector;

a beam separator coupled to and interconnecting the illumination electron optics, the objective electron optics, and the detection electron optics in such a way that there is a same angle between the first and second axes as between the second and third axes; and a beam deflector configured to controllably scan the primary electron beam across the substrate and to de-scan the emitted electron beam.

2. The apparatus of claim 1, wherein said same angle is ninety degrees such that the first axis is perpendicular to the second axis, the second axis is perpendicular to the third axis, and there is a straight line of sight between the illumination electron optics and the detection electron optics.

3. The apparatus of claim 1, wherein the apparatus is configured in a spectral integration mode such that the scattered electrons over a range of energies are detected.

4. The apparatus of claim 3, wherein the detected electrons include both backscattered electrons and secondary electrons.

5. The apparatus of claim 3, wherein the detector comprises a detector with an area of one square millimeter or less.

6. The apparatus of claim 1, further comprising an aperture positioned in an energy-dispersive plane in the detection electron optics.

7. The apparatus of claim 6, wherein the aperture is specifically positioned so as to select elastically backscattered electrons for detection.

8. The apparatus of claim 6, wherein the aperture is specifically positioned so as to select secondary electrons for detection.

9. The apparatus of claim 6, wherein the aperture is specifically positioned so as to select Auger electrons for detection.

10. The apparatus of claim 6, wherein the aperture is specifically positioned so as to select plasmons for detection.

11. The apparatus of claim 1, wherein the detector comprises an array of detector elements.

12. The apparatus of claim 11, wherein the array of detector elements is configured to detect an energy spectrum of scattered electrons per imaged pixel of the substrate.

13. The apparatus of claim 11, wherein the array of detector elements is a two-dimensional array, and wherein the detection electron optics is configured to generate a diffraction pattern on the two-dimensional array.

14. The apparatus of claim 1, further comprising an aperture positioned in a diffraction plane in the detection electron optics.

15. The apparatus of claim 14, wherein the aperture is specifically positioned so as to select diffracted electrons for dark field imaging.

16. The apparatus of claim 14, wherein the aperture is specifically positioned so as to select specular electrons for bright field imaging.

17. The apparatus of claim 1, further comprising at least one additional component positioned on a side of the beam separator directly opposing the objective optics so as to have a direct line of sight to the substrate.

18. The apparatus of claim 17, wherein the component comprises a flood gun.

19. The apparatus of claim 17, wherein the component comprises a laser, a semitransparent mirror, and a camera system.

20. A method of inspecting a substrate, the method comprising:

generating an incident electron beam;

deflecting the incident beam through a prism array by a fixed angle;

scanning the incident beam across the substrate;

focusing and decelerating the incident beam such that the incident beam impinges on a substrate;

retrieving an emitted electron beam;

de-scanning the emitted beam;

deflecting the emitted beam through the prism array such that electrons scattered without energy loss by the substrate are deflected by the specific angle; and focusing the emitted beam to a detection system.

21. The method of claim 20, wherein the specific angle is ninety degrees.

22. The method of claim 21, wherein the emitted electrons over a range of energies including backscattered electrons and secondary electrons are detected and imaged.

23. The method of claim 21, wherein the emitted electrons having a selected energy range are detected and imaged.

24. The method of claim 21, wherein the detection system includes an array of detector elements which detects an energy spectrum of the emitted beam per imaged pixel of the substrate.

25. The method of claim 21, wherein the detection system generates a diffraction pattern on a two-dimensional array of detector elements.

26. The method of claim 21, wherein an aperture is positioned so as to select diffracted electrons for dark field imaging.

27. The method of claim 21, wherein an aperture is positioned so as to select specular electrons for bright field imaging.

28. The method of claim 21, further comprising transmitting a beam through the prism array along a direct line of sight to the substrate.

29. A scanning electron beam instrument for inspecting a substrate, the instrument having curved electron-optical axes and comprising:

means for generating an incident electron beam;

means for deflecting the incident beam through a prism array by a specific angle;

means for scanning the incident beam across the substrate;

means for focusing and decelerating the incident beam such that the incident beam impinges on a substrate;

means for retrieving an emitted electron beam;

means for de-scanning the emitted beam;

means for deflecting the emitted beam through the prism array such that electrons scattered without energy loss by the substrate are deflected by the specific angle; and means for focusing the emitted beam to a detection system.

* * * * *